United States Patent [19]

Kitayama et al.

[11] Patent Number: 5,445,486
[45] Date of Patent: Aug. 29, 1995

[54] SUBSTRATE TRANSFERRING APPARATUS

[75] Inventors: Hirofumi Kitayama, Kanagawa; Hiroyuki Iwai, Sagamihara; Shinichi Wada, Sagamihara; Tetsu Oosawa, Sagamihara, all of Japan

[73] Assignee: Tokyo Electron Sagami Limited, Kanagawa, Japan

[21] Appl. No.: 263,216

[22] Filed: Jun. 17, 1994

Related U.S. Application Data

[63] Continuation of Ser. No. 38,644, Mar. 29, 1993, abandoned.

Foreign Application Priority Data

Mar. 29, 1992 [JP] Japan .................................. 4-102153

[51] Int. Cl.⁶ .............................................. B65G 65/00
[52] U.S. Cl. ..................................... 414/416; 414/937
[58] Field of Search ............... 414/416, 404, 331, 150, 414/152, 156, 935, 937, 940, 941

[56] References Cited

U.S. PATENT DOCUMENTS

| | | | |
|---|---|---|---|
| 4,744,709 | 5/1988 | Hertel et al. | 414/DIG. 3 X |
| 4,770,590 | 9/1988 | Hugues et al. | 414/331 X |
| 4,901,011 | 2/1990 | Koike et al. | 414/DIG. 3 X |
| 5,030,056 | 7/1991 | Kitayama et al. | 414/416 X |
| 5,044,752 | 9/1991 | Thurfjell et al. | 414/DIG. 3 X |
| 5,046,164 | 9/1991 | Harima | 414/404 X |
| 5,061,144 | 10/1991 | Akimoto et al. | 414/DIG. 3 X |
| 5,074,736 | 12/1991 | Ishii | 414/331 |
| 5,162,047 | 11/1992 | Wada et al. | 414/416 X |
| 5,177,514 | 1/1993 | Ushijima et al. | 414/DIG. 3 X |
| 5,183,370 | 2/1993 | Cruz | 414/DIG. 3 X |
| 5,217,340 | 6/1993 | Harada et al. | 414/331 X |

*Primary Examiner*—David A. Bucci
*Attorney, Agent, or Firm*—Oblon, Spivak, McClelland, Maier & Neustadt

[57] ABSTRACT

According to the invention, there is provided a substrate transferring apparatus for transferring substrates from a substrate transport container containing a plurality of substrates to be treated to a substrate holder for holding a plurality of substrates to be treated or vice versa, the apparatus including arms for supporting substrate, a supporting member for supporting the arms, and a drive arrangement for driving the supporting member to operate. Each of the arms include a plate shaped arm main body having a connecting section for connecting the arm to the drive arrangement, supporting sections having a thickness greater than that of the arm main body for supporting corresponding peripheral areas of the substrate, and stoppers having a thickness greater than that of the supporting sections for abutting lateral sides of the substrate to rigidly hold the substrate.

9 Claims, 8 Drawing Sheets

SUBSTRATE TRANSFERRING APPARATUS

This application is Continuation of application Ser. No. 08/038,644, filed on Mar. 29, 1993, now abandoned.

BACKGROUND OF THE INVENTION

1. Field of the Invention

This invention relates to an apparatus for transferring semiconductor substrates.

2. Description of the Related Art

Semiconductor substrates are normally housed in a substrate container such as wafer cassettes or wafer carriers when conveyed from a work station to another in a manufacturing line. Such containers are normally made of plastic material or a similar lightweight and low cost material.

On the other hand, plastic containers of the above described type cannot, however, be used when substrates are heat treated on a batch basis and, therefore, if such is the case, they are replaced by a substrate holder such as wafer boats as they are usually called, made of a material which is resistive to heat and corrosion, chemically stable and less liable to produce dusts such as quartz.

Normally, a particular apparatus is installed to automatically transfer semiconductor substrates from a substrate container to a substrate holder. Such a transferring apparatus typically comprises a number of arms for respectively supporting substrates, a drive means for driving the arms to operate and a rotating means for changing the direction to which the transferring apparatus is oriented. The arms of a transferring apparatus under consideration may be of the type that hold substrates by vacuum as disclosed in Published Unexamined Japanese Patent Application (JP-A) No. 2-71544 or the type that dispose substrates on respective supporting tables as disclosed in Published Examined Japanese Patent Application (JP-B) No. 2-39009 and JP-A-64-6047.

While the arm of the vacuum type is capable of securely holding a substrate, it can also gather and suck dusts from the surroundings, which by turn adhere to the substrate to consequently reduce the yield of manufacturing semiconductor devices.

With the arm of the supporting table type as disclosed in JP-B-2-39009, on the other hand, in a case that the substrate is charged, the entire surface of the substrate sustained on the table is held in contact with the surface of the wafer supporting table to generate static electricity between them that causes the substrate and the table to attract or repel each other. Consequently, the substrate is held on the supporting table under a rather unstable condition and can eventually drop from the table or generate dusts as they are scratched against each other. The generated dusts can by turn adhere to the substrate to consequently reduce the yield of manufacturing semiconductor devices as in the case of the vacuum type.

SUMMARY OF THE INVENTION

It is, therefore, an object of the present invention to provide a substrate transferring apparatus that reduces generation of static electricity while securely holding substrates and, at the same time, effectively prevents dusts from adhering to the substrates so that the operation of transferring substrates can be carried out in a reliable manner.

According to the invention, the above object is achieved by providing a substrate transferring apparatus for transferring substrates from a substrate transport container containing a plurality of substrates to be treated to a substrate holder for holding a plurality of substrates to be treated or vice versa, the apparatus comprising:
  arms for supporting substrates;
  a supporting member for supporting the arms; and
  a drive means for driving the supporting member to operate;
wherein each of the arms including:
  a plate-shaped arm main body having a connecting section for connecting the arm to the drive means;
  supporting sections having a thickness greater than that of the arm main body for supporting peripheral areas of the substrate; and
  stoppers having a thickness greater than that of the supporting sections for abutting lateral sides of the substrate to rigidly hold the object.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Now the present invention will be described in greater detail by referring to the accompanying drawings that illustrate a preferred embodiment of the invention.

Figure 1:
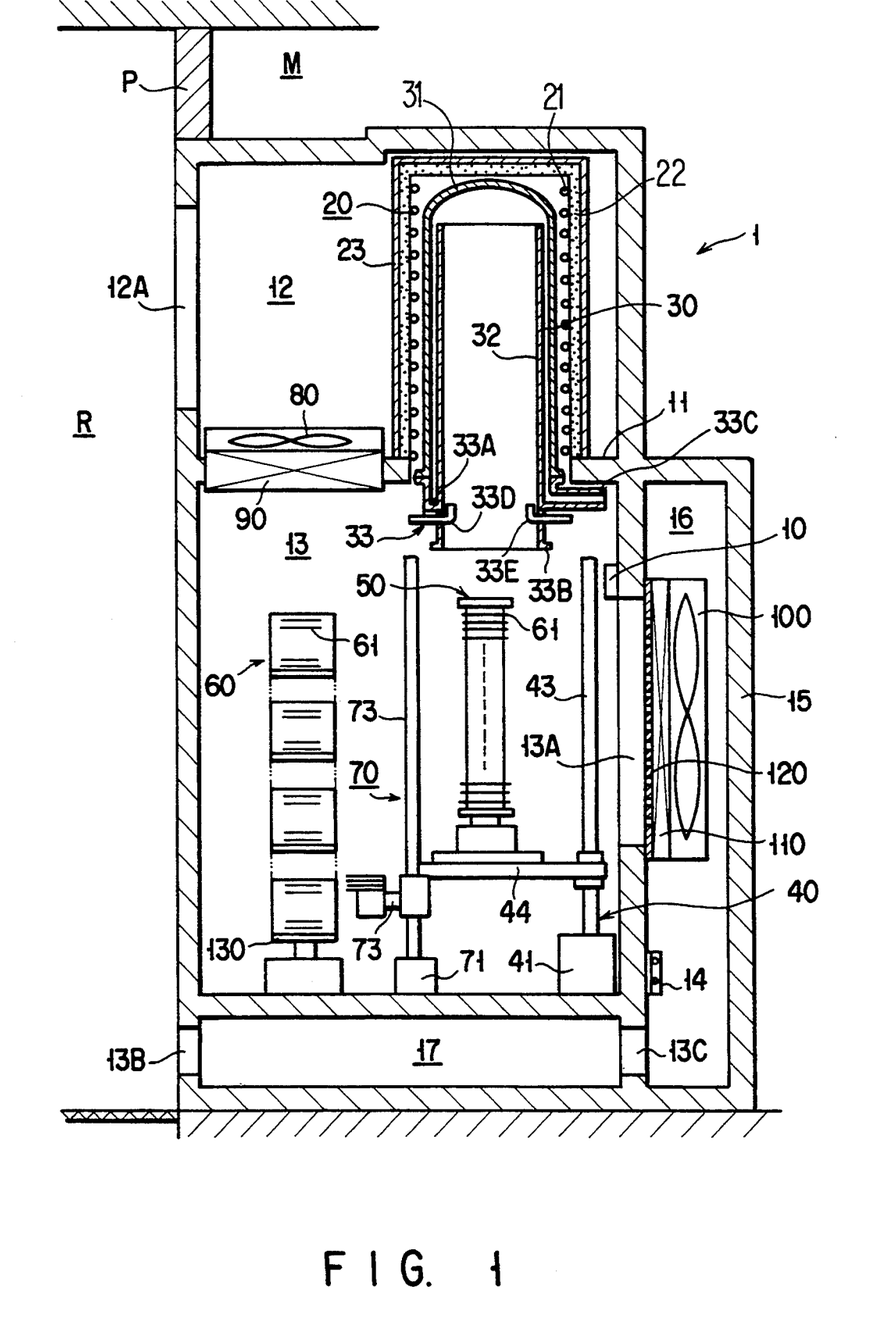
FIG. 1 is a schematic sectional view of a vertical-type heat treatment apparatus incorporating an embodiment of substrate transferring apparatus according to the invention.

FIG. 1 illustrates a schematic sectional view of a vertical-type heat treatment apparatus 1 incorporating an embodiment of substrate transferring apparatus according to the invention. Said heat treatment apparatus 1 is disposed in a maintenance room M and in contact with a clean room R. A lateral wall of the vertical-type heat treatment apparatus is connected to a separating wall P installed between the maintenance room M and the clean room R. Thus, the maintenance room M is partitioned by the separting wall P and the vertical-type heat treatment apparatus.

The vertical-type heat treatment apparatus 1 is divided into an upper chamber 12 and a lower chamber 13 by a partition 11. A vertical-type heating furnace 20 is vertically arranged in the upper chamber 12. A reaction vessel 30 having a double wall structure is housed in the heating furnace 20. Below the reaction vessel 30 and in the lower chamber 13 is disposed a lift mechanism 40 for raising and lowering a substrate holder (hereinafter referred to as wafer boat) 50 holding a number of substrates 61 horizontally with a given distance between any two adjacent ones in order to load them into or unload them from the reaction vessel 30. A substrate transferring apparatus 70 is disposed between the lift mechanism 40 and a substrate container (hereinafter referred to as wafer cassette) 60 for transferring the untreated substrates 61 from the wafer cassette 60 that contains them to the wafer boat 50 for heat treatment and then returning the substrates 61 from the wafer boat 50 to the wafer cassette 60 after heat treatment.

The upper chamber 12 is in communication with the clean room R through an opening 12A cut through the wall separating the clean room R and the maintenance room M and also with the lower chamber 13 through a fan 80 and a filter 90 disposed at an opening cut through the partition 11 that constitutes the floor of the upper chamber 12. The fan 80 draws clean air in the clean room R through the opening 12A and feeds it into the lower chamber 13 and the filter 90 removes dusts from the air being fed into the lower chamber 13 so that the wafer cassette 60 may be subjected to clean blowing air to prevent dusts from adhering to the substrates 61 on the wafer cassette 60. The filter 90 may typically be a HEPA filter or a ULPA filter.

A swing door 15 is fitted to the wall of the lower chamber 13 disposed opposite to the clean room R by means of hinges 14 and a first room 16 is formed inside the door 15 when the door 15 is closed. A fan 100, filter 110 (similar to the filter 90) and a reflector plate 120 are disposed inside the door 15 and at an opening 13A cut through the wall of the lower chamber 13 to which the door 15 is fitted. The first room 16 and the lower chamber 13 are held in communications with each other.

A second room 17 is arranged under the lower chamber 13. The clean room-side and the door-side walls partitioning the second room 17 and the clean room R are provided with an opening 13B and an opening 13C, respectively. Thus, the clean room R and the first room 16 are held in communication with each other so that air in the clean room R is blown into the lower chamber 13 by the fan 100. In other words, the second room 17 operates as an air duct connecting the clean room R and the lower chamber 13. The opening 13C is also provided with a filter (not shown). Therefore, a horizontal air flow is produced by the fan 100 to move clean air in the clean room R into the lower chamber 13 and blow it onto the substrates 61 held by the wafer boat 50 to prevent dusts from adhering to them. Since the heat emitted from the unloaded the wafer boat 50 after heat treatment is reflected into the lower chamber 13 by the reflector plate 120, the filter 110 is protected against any damaging heat.

The lower chamber 13 is also provided with a means for neutralizing any electric charges generated there such as an ionizer.

The heating furnace 20 disposed in the upper chamber 12 is a hollow cylinder which is closed at the top and open at the bottom. More specifically, the heating furnace 20 comprises a shell 23 made of stainless steel or a similar material and lined with a heat insulating member 22 and a helical heater 21 arranged on the inner surface of the heat insulating member 22. The heating furnace 20 can evenly and stably heat the inside of the reaction vessel 30 under a controlled manner by means of the heater 21 to temperature required for the heat treatment of substrates 61 typically between 500° and 1,200° C.

The reaction vessel 30 disposed in the heating furnace 20 is coaxially aligned with the heating furnace 20. The reaction vessel 30 is a double wall structure comprising an outer tube 31 which is made of a material resistive to heat and corrosion and closed at the top whereas it is open at the bottom and an inner tube 32 which is made of the material of the outer tube 31 and coaxially arranged within the outer tube 31 with a space provided therebetween.

The reaction vessel 30 is also provided with a manifold 33 pressed against the lower end of the outer tube 31 by a holding mechanism (not shown) with an O-ring (not shown) made of a heat-resistive and resilient material. The manifold 33 supports the inner tube 32 by means of an inwardly projecting extension 33A and can hermetically seal the reaction vessel 30 as a flange 33B disposed at its lower end is held in close contact with a corresponding flange of the wafer boat 50. The manifold 33 is by turn provided with a gas discharge pipe 33C made of a material same as that of the manifold 33 itself and connected to a gas discharge system comprising a vacuum pump for discharging a gas inside the reaction vessel 30 and first and second gas feed pipes 33D, 33E which are made of a material resistive to heat and corrosion such as quartz and disposed below the gas discharge pipe 33C, running through the manifold main body 33, the first and second gas feed pipes 33D, 33E being bent to have respective inner ends turned upward. The gas feed pipes 33D, 33E are connected to a gas supply source (not shown) for feeding gas necessary for the heat treatment of the substrates 61, involving gas diffusion.

Figure 2:
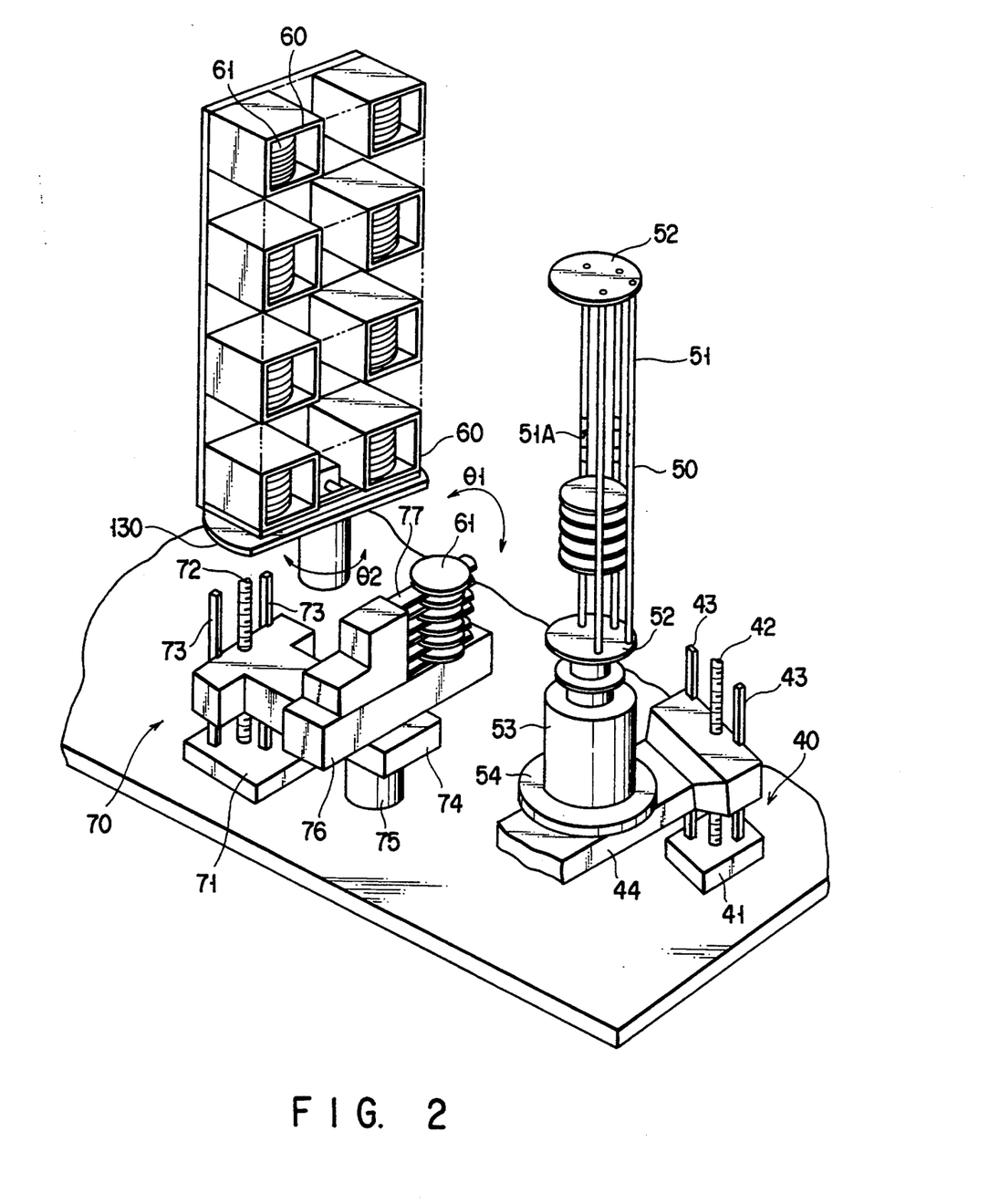
FIG. 2 is a enlarged partial perspective view of the vertical-type heat treatment apparatus of FIG. 1.

The lift mechanism 40 has a configuration as illustrated in FIG. 2. It comprises a drive section 41, to which a ball screw 42 is engaged. A pair of upright linear guides 43 are extending upward from the drive section 41. A supporting table 44 is engaged with the ball screw 42 so that it moves up and down as the ball screw 42 is driven to rotate by the drive section 41. The rising and falling movements of the supporting table 44 for a heat treatment operation is so programmed that the wafer boat 50 which is carrying substrates is automatically loaded into the reaction vessel 30 for heat treatment and then taken out of the reaction vessel 30 after the completion of the heat treatment.

The wafer boat 50 is made of a material such as quartz which is highly resistive to heat and corrosion and comprises four poles 51 each provided with a large number of horizontal grooves 51A typically between 100 and 150, a pair of discs 52 for securely and rigidly holding the upper and lower ends of the four poles 51, an insulating cylinder 53 disposed below the lower disc 52 and a flange 54 fitted to the lower end of the insulating cylinder 53.

The wafer boat 50 is so designed that it hermetically seals the reaction vessel 30 as the flange 54 abuts the flange 33B of the manifold 33 when the wafer boat 50 is loaded into the reaction vessel 30. The horizontal grooves 51A of each of the poles 51 are mutually spaced apart and arranged at a constant pitch. The distance between two adjacent ones of the grooves 51A is set such that an arm of the substrate transferring apparatus can be moved into the space between the two substrates held in two adjacent grooves without touching the substrates as will be described in greater detail hereinafter.

The substrate transferring apparatus 70 is disposed near the lift mechanism 40 and typically has a configuration as illustrated in FIG. 2. It comprises a drive section 71, to which a ball screw 72 is engaged. A pair of upright linear guides 73 are extending upward from the drive section 71. A supporting table 74 is engaged with the ball screw 72 so that it moves up and down as the ball screw 72 is driven to rotate by the drive section 71. A rotating drive mechanism 75 is fitted to a front area of the supporting table 74. A rectangular main body 76 is fitted to the drive shaft 75A (see FIG. 4) of the rotating drive mechanism 75 such that it is driven by the driving force of the drive mechanism 75 to rotate by an angle of $\theta_1$. The main body 76 is provided with a plurality of arms 77 (or six in the illustrated embodiment). The movements of the arms 77 for a heat treatment operation is so programmed that they transfer respective substrates 61 from the wafer boat 50 to the wafer cassette 60 and vice versa.

Figure 3:
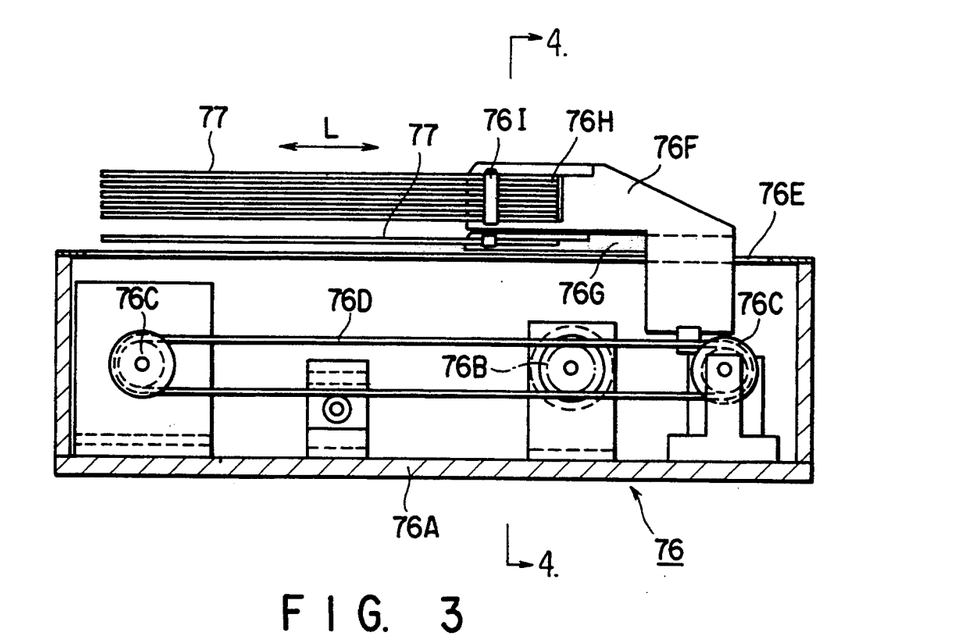
FIG. 3 is a longitudinal sectional view of the embodiment of substrate transferring apparatus incorporated in the apparatus of FIG. 2.
Figure 4:
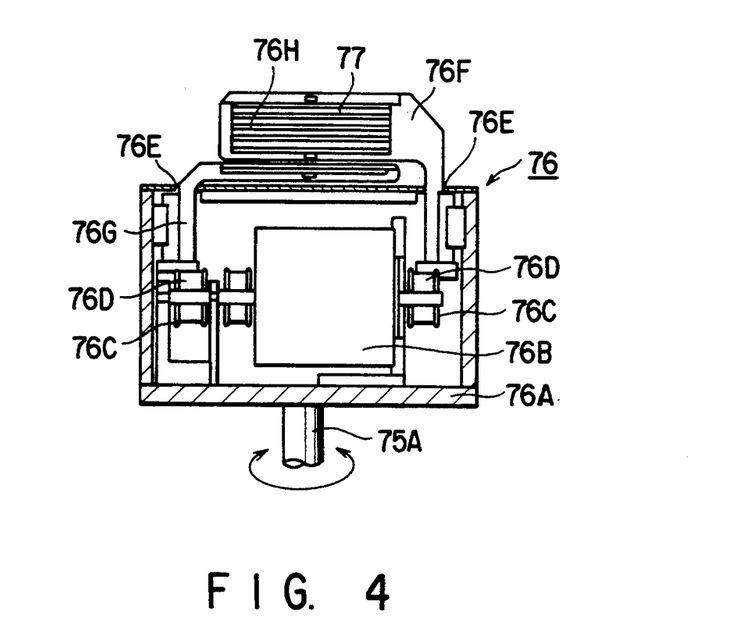
FIG. 4 is a sectional view of the embodiment of FIG. 3 cut along 4—4 line in FIG. 3.

The main body 76 has a configuration as illustrated in FIGS. 3 and 4. It comprises cabinet 76A, on which a pair of motors 76B (only one is shown) that operate independently are disposed. Each of the motors 76B is provided with two pairs of pulleys 76C respectively disposed at the front and rear ends thereof. Each of the two pairs of pulleys 76C are connected by a drive belt 76D, which is driven to run by the related motor 76B. First and second supporting members 76F and 76G are connected to the respective drive belts 76D. Two slits 76E are formed through the top wall of the cabinet and the first and second supporting members 76F and 76G runs through the respective slits 76E. A total of five arms 77 are commonly secured to an end section of the first supporting member 76F, whereas a single arm 77 is secured to a corresponding end section of the second supporting member 76G. The arms 77 secured to the first supporting member 76F and the arm 77 secured to the second supporting member 76G move back and forth in the directions as indicated by arrows L in FIG. 3 as the drive belts 76D are driven to run by the respective drive motors 76B. Thus, movement of the first supporting member 76F is utilized where it is desired to move five arms simultaneously, while supporting member 76G is utilized for independently moving a single arm.

As illustrated in FIG. 4, five arms 77 are interposed by a pair of plates at an end section of the first supporting member 76F with a spacer 76H disposed between any two adjacent arms 77 to separate them, the arms 77 and the spacers 76H being rigidly secured by means of a plurality of pins 76I. Similarly, a single arm 77 is interposed by a pair of plates at an end section of the second supporting member 76G.

The arms 77 are made of a ceramic that are resistive to heat and corrosion material such as silicon carbide, alumina, sapphire and the like or a material that do not damage substrates with which the arms may contact when substrates are put thereon. Alternatively, the arm main bodies may be made of alumina coated with silicon carbide by using a CVD technique or ion-plated with diamond. The efficient thickness of the coating layer of silicon carbide or diamond is between 50 and 100 $\mu$m. If the thickness is less than 50 $\mu$m, the coating layer can be affected by the unevenness of the surface of the arm main body, whereas, if the thickness exceeds 100 $\mu$m, the coating layer forming process is to be costly.

Figure 5:
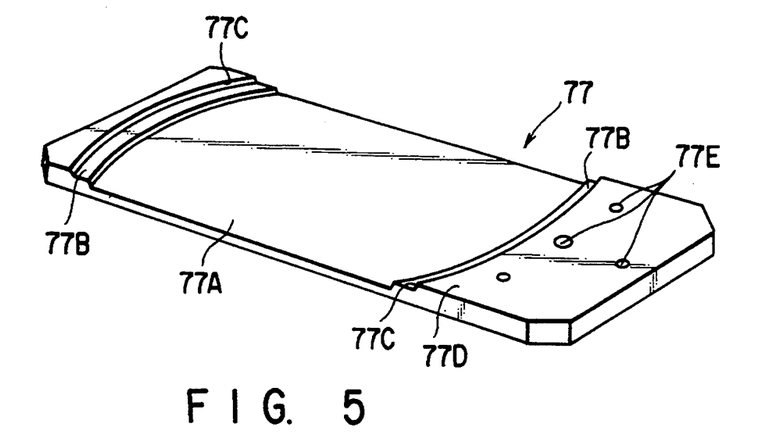
FIGS. 5 through 11 are respective schematic perspective views of alternative arms that can be used for the embodiment of substrate transferring apparatus of FIG. 3.

As illustrated in FIG. 5, each of the arms 77 comprises an arm main body 77A having a connecting section 77D for connecting the arm to a drive means, a pair of supporting sections 77B having a thickness greater than that of the arm main body for supporting corresponding peripheral areas of the substrate and a stopper 77C having a thickness greater than that of the supporting sections for abutting a lateral side of the substrate to rigidly hold the substrate.

If a 6-inch wafer is held by the arm, the arm main body 77A will have a thickness of approximately 0.8 mm (and the connecting section will have a thickness of 1.5 mm). If, on the other hand, an 8-inch wafer is handled by the arm, the thickness of the arm main body 77A will be approximately 1.1 mm (and that of the connecting section will be 2.1 mm). The arm main body 77A will be approximately 60 mm wide when it is used for a 6-inch wafer, whereas it will be approximately 70 mm wide when it is used for an 8-inch wafer.

The supporting sections 77B will have a thickness of approximately 0.3 mm if the arm is used for a 6-inch wafer, whereas its thickness will be approximately 0.5 mm if the arm handles an 8-inch wafer. These values are selected by considering the fact that a wafer normally show a maximum warp of approximately 150 $\mu$m when heat treated.

The stopper 77C may well have a thickness approximately 60% of that of the substrate to be handled by the arm. Therefore, if the substrate is a 6-inch wafer, the stopper 77C will have a thickness of approximately 0.4 mm or more (i.e., at least 60% of the wafer thickness), considering that the wafer is approximately 0.65 mm thick. If, on the other hand, the substrate is an 8-inch wafer, the stopper 77C will have a thickness of approximately 0.45 mm or more in view of the fact that the wafer is approximately 0.75 mm thick. The surface of the stopper 77C is preferably tapered toward the supporting section 77B disposed closer to it so that a substrate may easily and smoothly be moved onto and away from the arm.

The connecting section 77D of the arm main body 77A will have a thickness approximately between 1.3 to 1.5 mm if the substrate to be handled by the arm is a 6-inch wafer, whereas it will have a thickness approximately between 1.9 and 2.1 mm if the substrate is an 8-inch wafer. The holes in the connecting section 77D are used to receive pins 77E for securing the arm to the end section of the supporting member.

The arm can securely hold a substrate by means of the supporting sections 77B and the stopper 77C. If the substrate is warped by heat during heat treatment, the substrate will not come to contact the surface of the arm main body 77A because the supporting sections 77B are considerably thicker than the arm main body 77A. Additionally, the substrate carried by the arm is protected against any possible displacement and eventual falling that can take place when the arm is moving to transfer the substrate because of the provision of a pair of supporting sections 77B and a stopper 77C. Finally, any possible attractive force (in the case where the arm is made of silicon carbide) or repellent force (in the case where the arm is made of alumina) due to the static electricity generated between the arm 77 and the substrate will be significantly reduced because the supporting sections 77B of the arm touch only small peripheral areas of the substrate.

Figure 6:
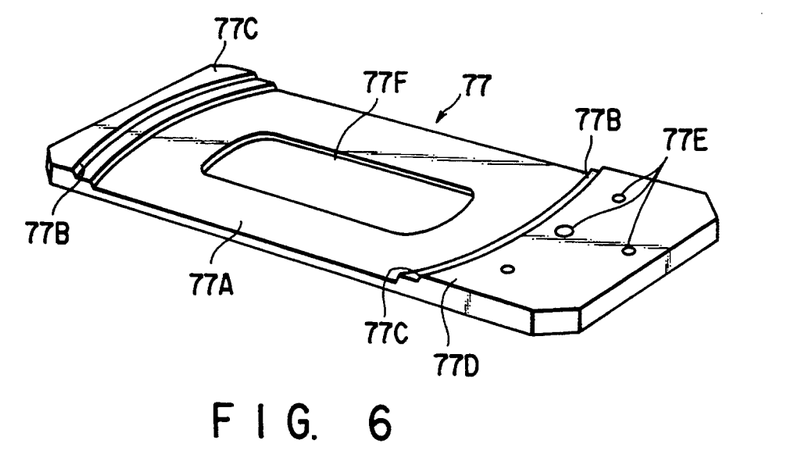
Figure 7:
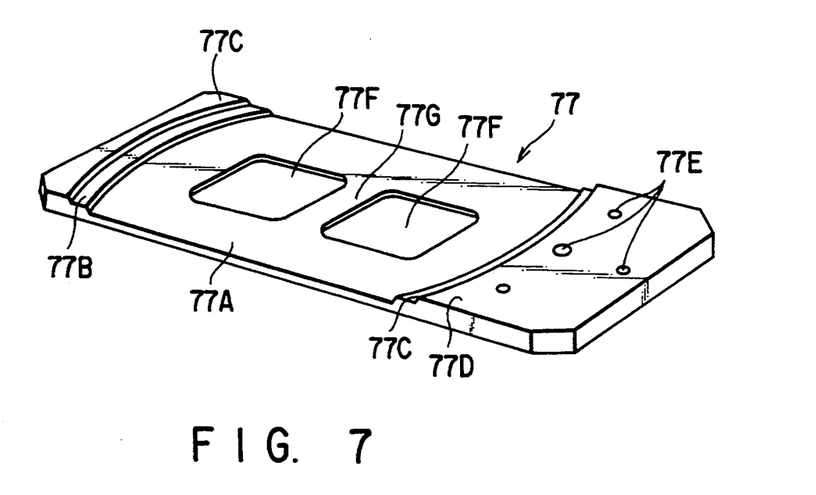

The attractive or repellent force due to the static electricity generated between the arm 77 and the substrate can be further reduced if a longitudinally oblong hole 77F is formed approximately at the center of the arm main body 77A as illustrated in FIG. 6 in order to reduce the surface area of the arm main body 77A that can be electrically charged. The provision of such a hole 77F can also suppress adhesion of dusts to the arm 77 because it allows a large downward flow of air. The static electric charge on the arm can be reduced by an electric charge neutralizing means as illustrated in FIG. 1. FIG. 7 shows an alternative arm having a pair of holes 77F separated by a dividing section 77G. With such an arrangement, the mechanical strength of the arm main body 77A may be improved as compared with that of FIG. 6, while the arm may also allow a large downward flow of air.

Figure 8:
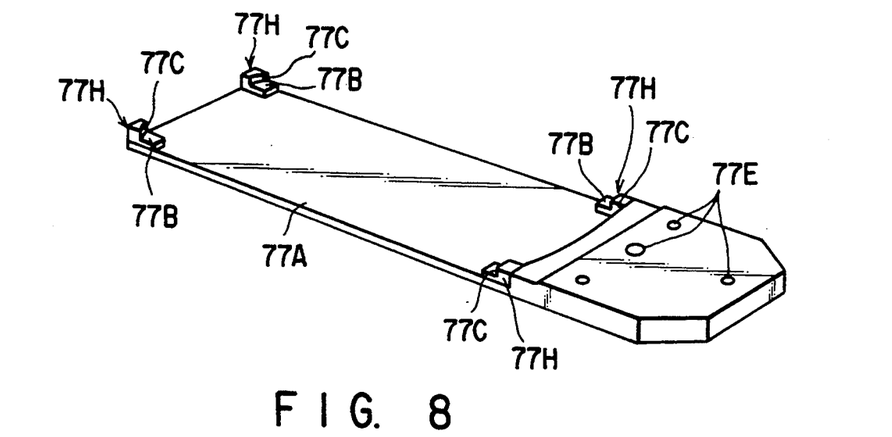

FIG. 8 shows another alternative arm, in which the stopper 77C and the supporting sections 77B of the arm of FIG. 5 are replaced by a set of blocks 77H rigidly fitted to the arm main body 77A at the four corners by adhesion or glass welding. Since the areas where the supporting sections 77B contact with the substrate are significantly reduced with such an arrangement if compared with the arms of FIGS. 5 through 7, adhesion of dusts to the substrate is further suppressed to improve the yield of manufacturing substrates using such arms.

Figure 9:
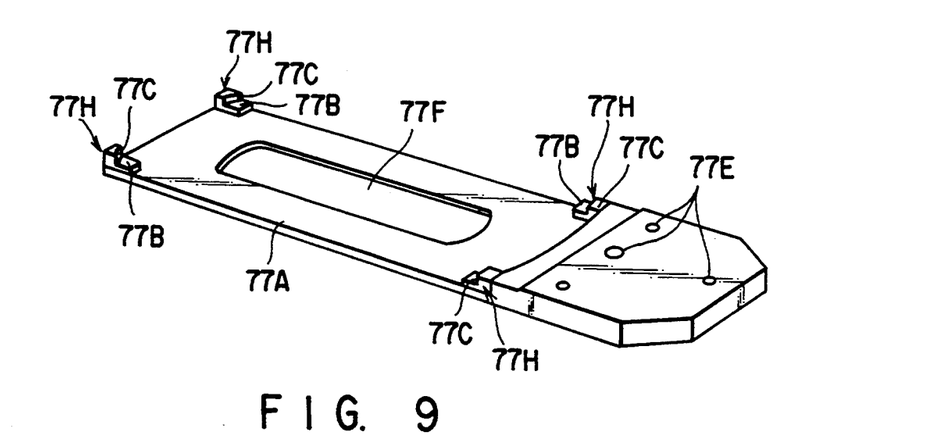
Figure 10:
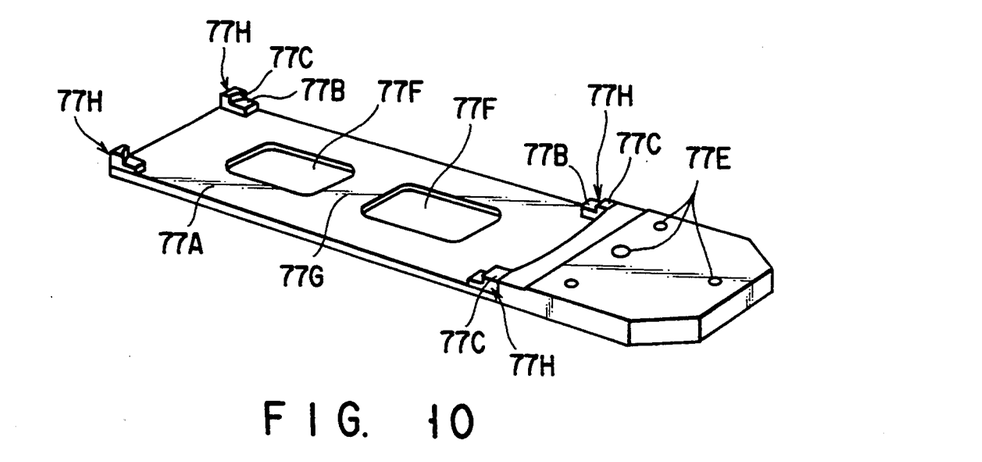

FIGS. 9 and 10 illustrate still other alternative arms that respectively resemble the arms of FIGS. 6 and 7 having one or more holes 77F but in each of which the stopper is replaced by a set of blocks 77H rigidly fitted to the arm main body 77A to reduce the area of contact between the supporting sections 77B and the substrate while maintaining a large downward flow of air. The arm of FIG. 10 having a pair of holes 77F separated by a dividing section 77G will show a particularly enhanced mechanical strength of the arm main body 77A.

Figure 11:
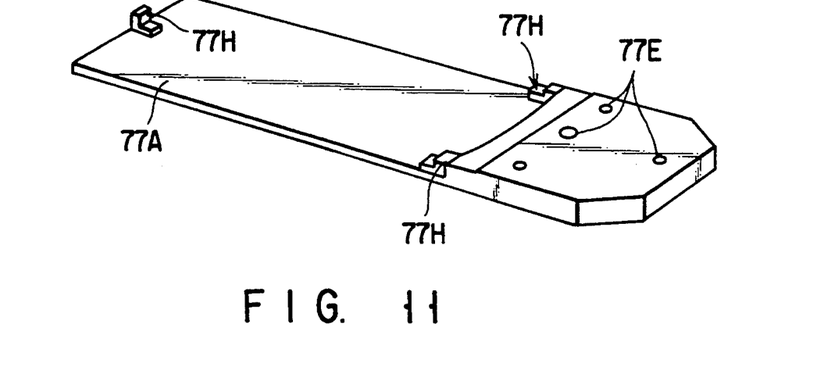

While each of the arms of FIG. 9 and 10 is provided with four blocks 77H, each comprising a supporting section 77B and a stopper 77C, the number of blocks to be used for a single arm is not limited to four and may be varied so long as a substrate is securely held in position by the blocks. FIG. 11 illustrates an alternative arm provided with three blocks 77H arranged on an arm main body 77A.

Figure 12:
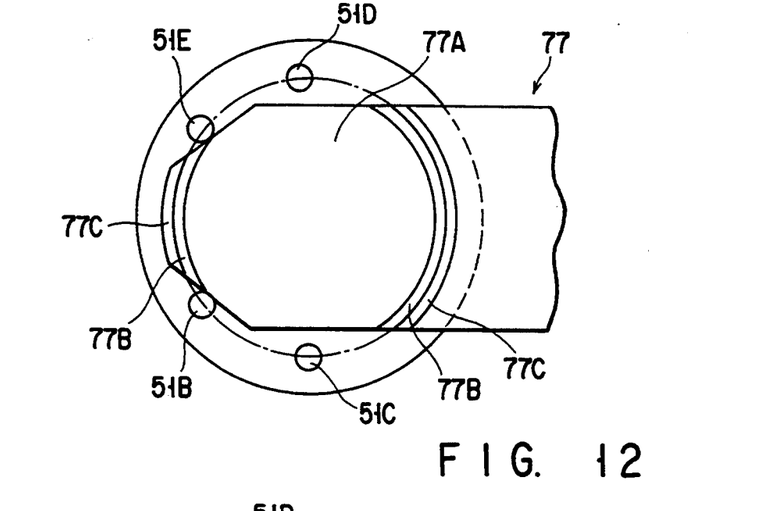
FIGS. 12 through 17 are respective schematic plan views of the alternative arms.

The form of the arm main body 77A needs to be determined by considering the arrangement of poles 51 of wafer boat 50. FIG. 12 shows a typical arrangement of poles 51B through 51E of wafer boat 50. The arm 77 is inserted between a pole 51B and another pole 51E for loading a substrate on a wafer boat 50. Therefore, the width of the arm main body 77A needs to be smaller than the distance separating the poles 51B and 51E. Thus, the arm main body 77A is normally realized in an oblong and substantially rectangular form as illustrated in any of FIGS. 5 through 11.

Figure 13:
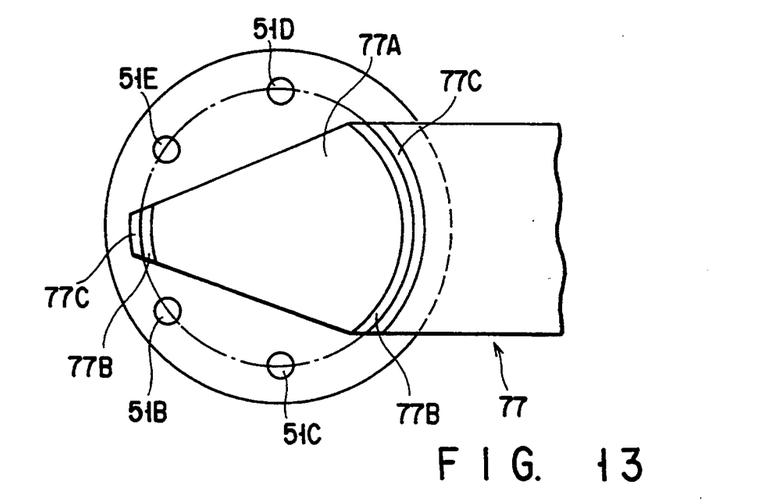
Figure 14:
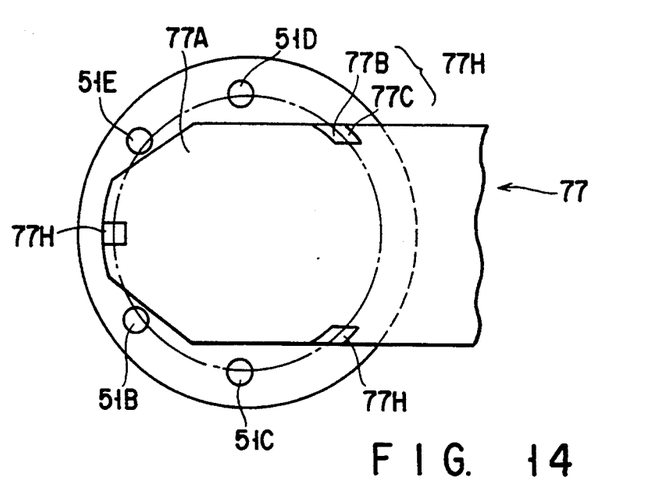

The form of the arm main body 77A is, however, not limited to that of any of FIGS. 5 through 11 and may be so realized as to show a tapered front end section opposite to the connecting section as illustrated in FIG. 12 to reduce the possibility with which the front end of the arm main body 77A collides with the pole 51B or 51E. Alternatively, the arm main body 77A itself may be tapered toward the front end as illustrated in FIG. 13. In any case, the arm main body 77A has a rather large proper width to stably support a substrate on it. FIG. 14 illustrates a still another alternative arm, where blocks 77H, each comprising a supporting section 77B and a stopper 77C, are adhered to the surface of the arm main body 77A.

Figure 15:
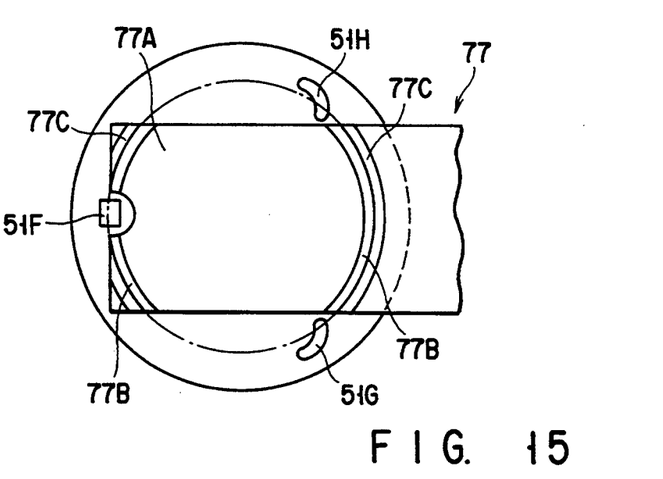
Figure 16:
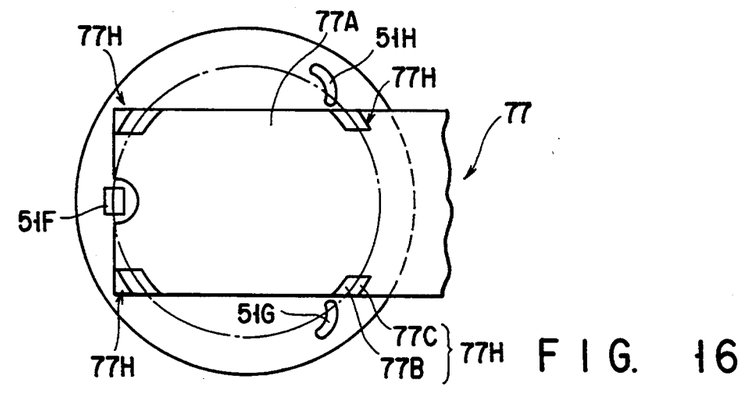
Figure 17:
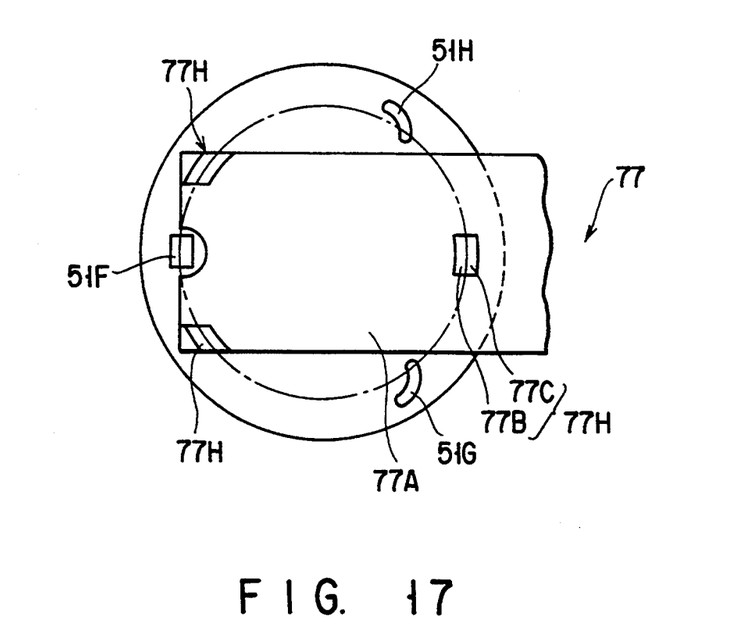

If poles 51F through 51H are arranged on a wafer boat 50 in a manner as illustrated in FIG. 15, the arm main body 77A may alternatively be provided with a semicircular cut out area at the center of the front end for receiving a pole 51G without touching it. FIG. 16 illustrates a still another alternative arm main body 77A provided with a semicircular cut-out area and additionally with four blocks 77H adhered on the arm main body 77A, each of the blocks comprising a supporting section 77B and a stopper 77C. FIG. 17 shows a still another alternative arm main body 77A which resembles to that of FIG. 16 but provided with only three blocks 77H.

Figure 18:
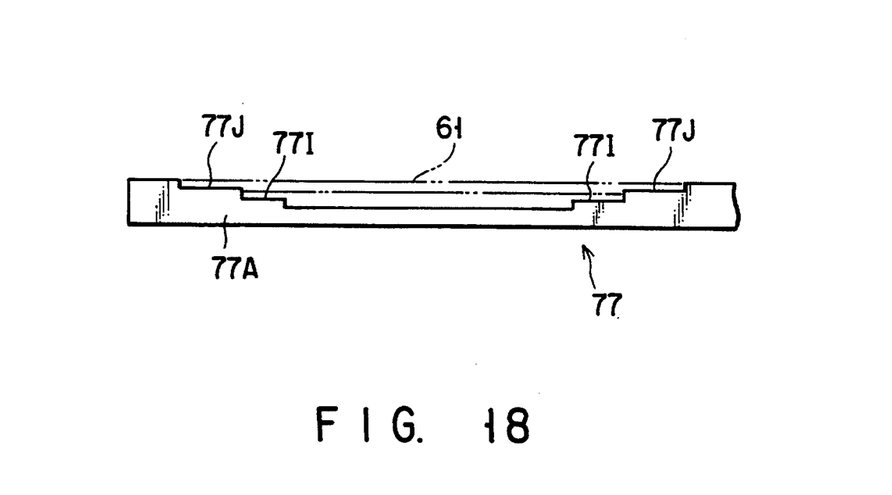
FIG. 18 is a lateral view of the arm of the embodiment of substrate transferring apparatus.

In order to reduce the weight of the arm main body 77A, it may be so realized as to show a thickness that gradually decreases toward the front end thereof. Alternatively, it may be realized by bonding a flat plate and a plate having a recess to form a hollow central area to achieve the same objective. Still alternatively, the arm main body 77A may be provided with a plurality of recessed steps and a plurality of supporting sections such that it may be used for substrates with different sizes. FIG. 18 typically shows such an alternative arm main body 77A having two recessed steps respectively with two different sets of supporting sections 77I and 77J so that they may be used respectively for a 6-inch wafer and an 8-inch wafer.

The alternative configurations of the arm main body 77A of FIGS. 5 through 18 may be appropriately combined to produce additional alternative arm main bodies.

The wafer cassette 60 as illustrated in FIG. 2 is of a known conventional type made of a material resistive to heat and corrosion. It can normally contain as many as 25 substrates such as those to be heat treated and/or dummy substrates as well as substrates to be used for monitoring purposes and is provided on the inner surface of its rectangular cabinet with a plurality of horizontal grooves arranged at a given pitch for holding substrates. A number of wafer cassettes 60 having a configuration as described above is commonly placed on a supporting table 130 that can be rotated by angle $\theta_2$ in the directions as indicated by arrows in FIG. 2 by means of a drive mechanism (not shown). The drive mechanism for the supporting table 130 is so controlled by a program that, when the main body 76 of the substrate transferring apparatus 70 is raised or lowered to make itself ready to take out the substrates in the wafer cassettes 60, the wafer cassettes 60 are disposed exactly vis-a-vis the main body 76 of the substrate transferring apparatus 70.

A vertical-type heat treatment apparatus incorporating a substrate transferring apparatus 70 according to the invention will operate in a manner as described below, following a program stored in the control unit of the heat treatment apparatus.

Firstly, for heat treatment of substrates 61, the cassette supporting table 130 is rotated by the drive mechanism. Simultaneously, the lift mechanism 71 is operated to drive the ball screw 72 to rotate so that the supporting table 74 is raised or lowered along the linear guides 73, while the drive mechanism 75 is operated to drive the main body 76 to rotate until a particular wafer cassette 60 is situated exactly vis-a-vis the substrate transferring apparatus 70.

Then, the motor 76B of the main body 76 of the substrate transferring apparatus 70 is operated to drive the drive belts 76D to run and move the first supporting member 76F connected to the drive belts 76D. Thus, the five arms 77 fitted to the first supporting member 76F is moved forward from the main body 76 simultaneously and inserted into the respective spaces separating the substrates 61 to be taken out of a wafer cassette 60. The substrates 61 then come to be supported at peripheral areas by the respective sets of supporting sections 76B of the arms 77 when the arms are slightly raised. As the motor 76 is reversely driven under this condition to make the drive belts 76D to run in the reverse direction and retract the arms 77 from the wafer cassette 60, the five substrates 61 are moved out of the wafer cassette 60. Note that each of the substrate 61 is securely held onto the corresponding arm 77 by a set of supporting sections 77B and stoppers 77C of the arm 77. Any static electric charge that may be generated between each of the arms 77 and the substrate 61 held on it will be neutralized by an electric charge neutralizing means.

Then, the lift mechanism 71 and the drive mechanism 75 are operated to raise or lower the supporting table 74 along the linear guides 73 and simultaneously rotate the main body 76 until the substrate transferring apparatus 70 comes vis-a-vis the wafer boat 50 located at the unloading position. Then, the motor 76B of the main body 76 of the substrate transferring apparatus 70 is operated to drive the drive belts 76D to run so that the first supporting member 76F connected to the drive belts 76D is moved accordingly. The five arms 77 fitted to the first supporting member 76F and now supporting the substrates 61 are simultaneously moved forward from the main body 76 and inserted into the wafer boat 50. Under this condition, the substrates 61 are received at peripheral areas in the respective grooves 51A of the poles 51. When the arms 77 are lowered slightly, the substrates 61 on the respective arms 77 come to be totally supported by the wafer boat 50. Under this condition, the motor 76B is reversely driven to make the drive belts 76D to run in the reverse direction and retract the arms 77 from the wafer boat 50. Now, a first cycle of operation of transferring substrates is completed. This cycle of operation will be repeated for several times until a predetermined number of substrates 61 are moved from the wafer cassette 60 to the wafer boat 50 for heat treatment.

When the operation of transferring a predetermined number of substrates 61 into the wafer boat 50 on the unloading position is over, the lift mechanism 40 will be subsequently operated for a next sequence of operation. More specifically, as the drive section 41 is driven to rotate the ball screw 42, the supporting table 44 is raised along the linear guides 43 until the wafer boat 50 is loaded into the reaction vessel 30. When a predetermined heat treatment operation is completed, the drive section 41 is operated again to drive the ball screw 42 to rotate in the reverse direction and lower the supporting table 44 along the linear guides 43 until the wafer boat 50 is completely moved unloaded from the reaction vessel 30. Thereafter, the heat treated wafer substrates 61 are taken out of the wafer boat 50 by means of the substrate transferring apparatus 70 and loaded into a given wafer cassette 60.

Since the substrates 61 are supported by the respective arms and the poles only at certain peripheral areas during the above described transferring operation, they are held under a stable condition and not significantly affected by static electricity. Additionally, since each arm 77 is provided with a number of stoppers 77C, the substrate 61 on it will not drop from it if the arm 77 is horizontally slued.

While the present invention has been described above in terms of an embodiment incorporated into a vacuum type heat treatment apparatus, a substrate transferring apparatus according to the invention may alternatively be used for an atmospheric pressure type heat treatment apparatus or any other apparatus involving the operation of transferring substrates.

As described above in detail, substrates can be can stably be transferred from a substrate container to a substrate holder or vice versa by a substrate transferring apparatus according to the invention without being affected by static electricity and without fear of dropping because they are supported by respective supporting sections and stoppers of arms only at certain peripheral areas thereof. Thus, a substrate transferring apparatus according to the invention can effectively prevent dusts from adhering to the substrate and hence improve the yield of manufacturing semiconductor substrates.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A substrate transferring apparatus for transferring substrates from a substrate transport container containing a plurality of substrates to be treated to a substrate holder for holding a plurality of substrates to be treated or vice versa, said apparatus comprising:
   arms for supporting the substrates, each of said arms having a free end and a fixed end; and
   drive means for driving the arms;
   wherein each of said arms includes:
   a plate-shaped arm main body having a thin portion and a connecting section provided on the fixed end for connecting the arm to said drive means;
   supporting sections having a thickness greater than that of the thin portion of the arm main body for supporting corresponding peripheral areas of the substrate; and
   stoppers having a thickness greater than that of the supporting sections for abutting lateral sides of the substrate to hold the substrate;
   wherein each of said arm main bodies has a hole formed at a central area thereof such that an amount of electric charge on said arms is decreased, each of said arm main bodies also having a dividing section for dividing said hole.

2. The apparatus according to claim 1, wherein each of said supporting sections has a thickness large enough to accommodate possible deformation of the substrate.

3. The apparatus according to claim 1, wherein each of said stoppers has a thickness at least 60% of the thickness of the substrate.

4. The apparatus according to claim 1, wherein each of said supporting sections includes at least one of said stoppers fitted onto the plate-shaped arm main body.

5. The apparatus according to claim 4, wherein said supporting sections and said stoppers are blocks rigidly fitted to the corresponding arm main body by a method selected from the group consisting of adhesion and welding.

6. The apparatus according to claim 1, wherein each of said arms has at least three blocks with said blocks providing said supporting sections and said stoppers.

7. The apparatus according to claim 1, wherein each of said arms is made of a material selected from the group consisting of silicon carbide, alumina and sapphire.

8. The apparatus according to claim 1, wherein each of said arms is made of alumina coated with a material selected from the group consisting of silicon carbide and diamond.

9. The apparatus according to claim 1, wherein each of said arms is provided with a recess having a plurality of steps, said steps forming a plurality of different supporting section.

* * * * *